United States Patent
Wan et al.

(10) Patent No.: US 8,854,856 B2
(45) Date of Patent: Oct. 7, 2014

(54) METHODS AND APPARATUS FOR ROM DEVICES

(71) Applicant: Taiwan Semiconductor Manufacturing Company, Ltd., Hsin-Chu (TW)

(72) Inventors: He-Zhou Wan, Shanghai (CN); Shao-Yu Chou, Chu-Pei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/918,324

(22) Filed: Jun. 14, 2013

(65) Prior Publication Data

US 2014/0198555 A1 Jul. 17, 2014

Related U.S. Application Data

(60) Provisional application No. 61/777,184, filed on Mar. 12, 2013.

(51) Int. Cl.
| | |
|---|---|
| *G11C 17/00* | (2006.01) |
| *G11C 16/10* | (2006.01) |
| *G11C 11/416* | (2006.01) |
| *G11C 8/04* | (2006.01) |
| *G11C 17/08* | (2006.01) |
| *G11C 17/12* | (2006.01) |
| *G11C 17/14* | (2006.01) |
| *G11C 7/10* | (2006.01) |
| *G11C 13/00* | (2006.01) |

(52) U.S. Cl.
CPC ............... *G11C 17/08* (2013.01); *G11C 17/14* (2013.01); *G11C 7/1006* (2013.01); *G11C 16/10* (2013.01); *G11C 17/12* (2013.01); *G11C 7/10* (2013.01); *G11C 13/0069* (2013.01)
USPC ..................................... 365/104; 365/189.17

(58) Field of Classification Search
CPC .... G11C 17/12; G11C 17/14; G11C 13/0069; G11C 7/1006; G11C 7/10; G11C 16/10
USPC ............................................ 365/104, 189.14
See application file for complete search history.

(56) References Cited

U.S. PATENT DOCUMENTS

| | | | | |
|---|---|---|---|---|
| 4,399,535 A | * | 8/1983 | Southard | 370/525 |
| 2014/0064001 A1 | * | 3/2014 | Heo | 365/203 |

* cited by examiner

*Primary Examiner* — Ly D Pham
(74) *Attorney, Agent, or Firm* — Slater & Matsil, L.L.P.

(57) ABSTRACT

Methods and apparatus for the encoding of an input sequence of digit data into a sequence of storage cells of a ROM device are disclosed. The input sequence is divided into a first kind of groups and a second kind of groups. A first kind of group comprises a plurality of consecutive first digits, two first kind of groups are separated by a second kind of group, the second kind of group comprises consecutive digits without any consecutive first digits, and the second kind of group has a starting digit which is the second digit. A starting storage cell is programmed to the active state to store the starting digit of the second kind of group. The rest digits of the second kind of group are programmed one digit at a time, based on a shared terminal which has been programmed for the proceeding storage cell.

20 Claims, 11 Drawing Sheets

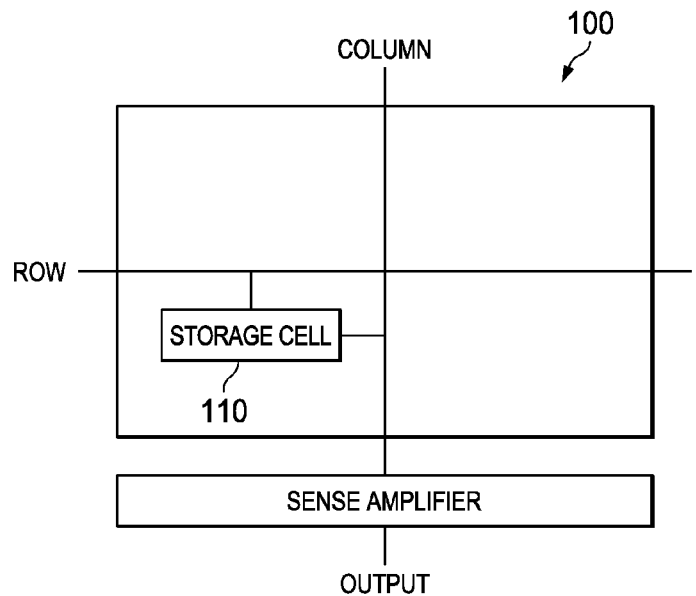
FIG. 1(a)
| | STORAGE CELL STATE | |
|---|---|---|
| 0 | ACTIVE | INACTIVE |
| 1 | INACTIVE | ACTIVE |
FIG. 1(b)
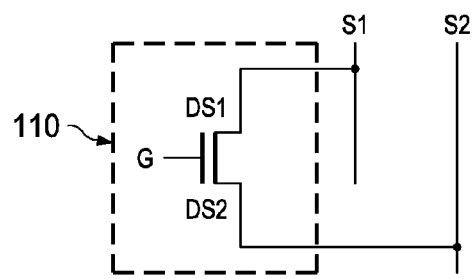
FIG. 2(a)

US 8,854,856 B2

METHODS AND APPARATUS FOR ROM DEVICES

This application claims priority to U.S. Provisional Application No. 61/777,184, filed on Mar. 12, 2013, entitled Methods and Apparatus for ROM Devices which is incorporated herein by reference and Chinese Patent Application 201310015340.7, filed on Jan. 16, 2013 which is also incorporated herein by reference.

BACKGROUND

Modern electronic devices such as notebook computers comprise a variety of memories to store information. Memory circuits include two major categories. One is volatile memories, the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered. On the other hand, non-volatile memories can keep data stored on them without power. Non-volatile memories include a variety of sub-categories, such as read-only-memory (ROM), electrically erasable programmable read-only memory (EEPROM), and flash memory.

ROM devices are a kind of memory where, in normal system operation, the memory is read but not changed. Usually, ROM devices are used for high volume controlled applications such as the set of instructions that is needed to make the computer system ready for use when its power is turned on. These instructions are startup instructions, commonly found in a ROM device.

A ROM device comprises an array of storage cells. A sequence of digital data comprising ones and zeros are stored in the array of storage cells of the ROM device. Each storage cell is connected to a bit line and a word line, and stores a zero or an one. There may be different ways to store the ones and zeros in the storage cells of the ROM device. Current technology for ROM devices may use an encoding of the ones and zeros into the storage cells resulting in a large number of storage cells, a large storage line capacitance, and high power consumptions. New encoding and implementation of digital information of ones and zeros into the storage cells for the ROM device is needed.

BRIEF DESCRIPTION OF THE DRAWINGS

For a more complete understanding of the present disclosure, and the advantages thereof, reference is now made to the following descriptions taken in conjunction with the accompanying drawing, in which:

FIGS. 1(a)-1(b) illustrate an exemplary read-only-memory (ROM) device, with various encoding schemes of zero and one into the active state and the inactive state of a storage cell of the ROM device, in accordance with some embodiments;

FIGS. 2(a)-2(c) illustrate various exemplary schematic and layout designs of an active storage cell, in accordance with some embodiments;

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

Figure 2B:
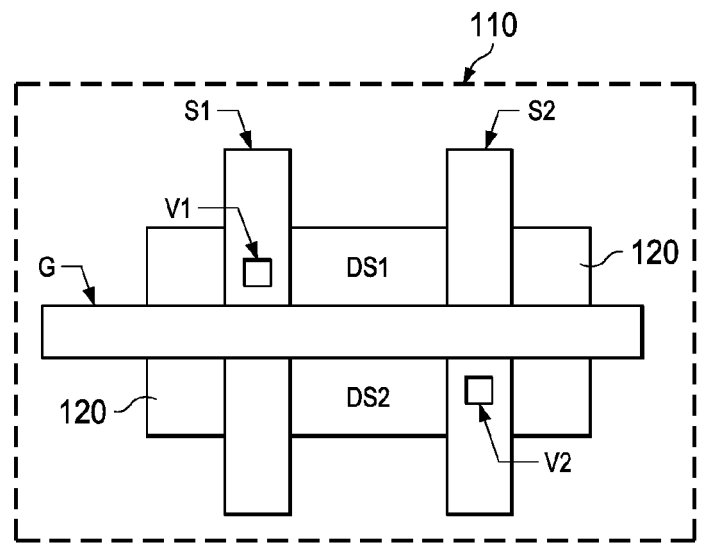

The making and using of the present embodiments are discussed in detail below. It should be appreciated, however, that the present disclosure provides many applicable inventive concepts that can be embodied in a wide variety of specific contexts. The specific embodiments discussed are merely illustrative, and do not limit the scope of the disclosure.

The present disclosure will be described with respect to embodiments in a specific context, namely the encoding of an input sequence of digit data of first digits and second digits into a sequence of storage cells of a ROM device. A storage cell can store a digit to an active state or an inactive state. The input sequence is divided into a first kind of groups and a second kind of groups. A first kind of group comprises a plurality of consecutive first digits, two first kind of groups are separated by a second kind of group, the second kind of group comprises consecutive digits without any consecutive first digits, and the second kind of group has a starting digit which is the second digit. A starting storage cell is programmed to the active state to store the starting digit of the second kind of group. The rest digits of the second kind of group are programmed one digit at a time, based on a shared terminal which has been programmed for the proceeding storage cell. The first kind of groups are programmed after the second kind of groups have been programmed and stored into the corresponding storage cells.

It will be understood that when an element or layer is referred to as being "on," "connected to" or "coupled to" another element or layer, it can be directly on, or connected or coupled to the other element or layer or intervening elements or layers may be present. In contrast, when an element is referred to as being "directly on," "directly connected to" or "directly coupled to" another element or layer, there are no intervening elements or layers present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" or "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising,"—when used in this specification, specify the presence of stated features, integers, steps, operations, elements, and/or components, but do not preclude the presence or addition of one or more other features, integers, steps, operations, elements, components, and/or groups thereof.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIGS. 1(a)-1(b) illustrate an exemplary read-only-memory (ROM) device 100, with various encoding schemes of zero and one into an active state and an inactive state of a storage cell 110 of the ROM device 100, in accordance with some embodiments.

The ROM device 100 illustrated in FIG. 1(a) may be a mask programmable ROM (MROM), an erasable programmable ROM (EPROM), an one time programmable EPROM (OTP), an electrically erasable and programmable ROM (EEPROM), a flash memory, or any other suitable ROM device.

The ROM device 100 may comprise a plurality of storage cells connected to a plurality of word lines and bit lines organized as rows and columns of a storage array. One such storage cell 110 is illustrated in FIG. 1(a), which is connected to a row line and a column line, where the row line and column line may be the word line and bit line of the storage array respectively. The content of the storage cell 110 is read into a sense amplifier which senses the data stored in the storage cell 110, and amplifies the small voltage swing to recognizable logic levels so the data can be interpreted properly at the output of the ROM device 100.

The storage cell 110 has an active state and an inactive state, depending on whether there is a conducting current in the storage cell 110 once a voltage is applied to the storage cell 110. When there is no current in the storage cell 110 once a voltage is applied, it is in the inactive state. On the other hand, the storage cell 110 is in the active state when there is a current in the storage cell 110 once a voltage is applied. The storage cell 110 can be implemented as a single transistor. The storage cell 110 may be implemented in other ways as well.

As illustrated in FIG. 1(b), the storage cell 110 can store the digit zero as the active state, and store the digit one as the inactive state. On the other hand, it is also possible to store the digit zero as the inactive state, and store the digit one as the active state. The correspondence of the digit one and zero with the active and the inactive state of the storage cell 110 can be made in either way. For the rest of the disclosure, an assumption is made that a zero is stored as the inactive state, and an one is stored as the active state. However, the disclosure may be easily applied to the case when a zero is stored as the active state, and an one is stored as the inactive state.

Figure 2C:
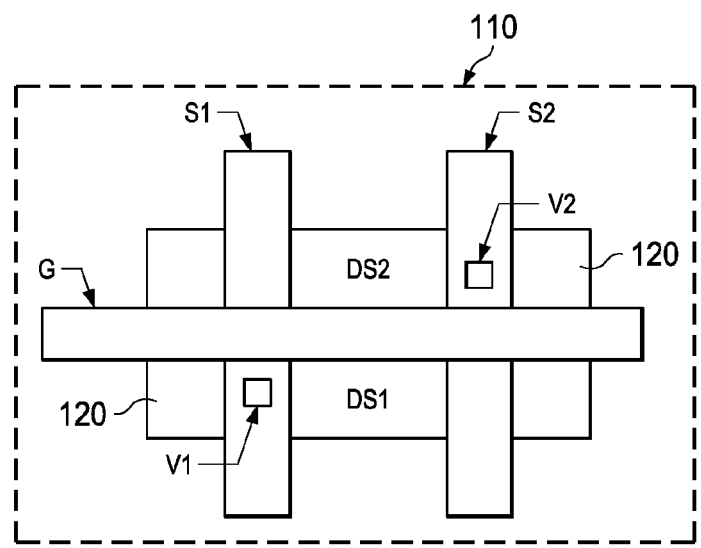

FIGS. 2(a)-2(c) illustrate various exemplary schematic and layout designs of an active storage cell 110, in accordance with some embodiments. The storage cell 110 shown in FIG. 2(a)-2(c) may be the storage cell 110 shown in FIG. 1(a). The storage cell 110 is implemented as a transistor 110 with a first terminal DS1 connected to a first signal line S1, and a second terminal DS2 connected to a second signal line S2.

FIG. 2(a) illustrates a schematic design of the transistor 110 with a gate G, a first terminal DS1, and a second terminal DS2. The first terminal DS1 may be a source of the transistor 110 and the second terminal DS2 may be a drain of the transistor 110. On the other hand, the first terminal DS1 may be the drain of the transistor 110 and the second terminal DS2 may be the source of the transistor 110. The source and the drain of the transistor 110 are symmetric, and they can be placed as either side of the gate G of the transistor 110.

The first signal line S1 may be a bit line and the second signal line S2 may be a ground line, or a power line. On the other hand, the first signal line S1 may be the ground line, or the power line, and the second signal line S2 may be the bit line.

The transistor 110 is in the active state when the first terminal DS1 of the transistor 110 is connected to the first signal line S1, and the second terminal DS2 of the transistor 110 is connected to the second signal line S2. When the transistor 110 is in the active state, there is a conductive path from the first signal line S1, to the first terminal DS1, flowing through a channel under the gate G to the second terminal DS2, which is further connected to the second signal line S2. The connection between the first terminal DS1 with the first signal line S1 is only for illustration. The transistor 110 is in the active state when there is one connection between the first terminal DS1 of the transistor 110 with one of the first signal line S1 and the second signal line S2, and another connection between the second terminal DS2 of the transistor 110 with another of the first signal line S1 and the second signal line S2.

FIG. 2(b) illustrates a layout implementing the schematic transistor 110 shown in FIG. 2(a). An active area 120 comprises the first terminal DS1 and the second terminal DS2. The gate G is above the active area 120. The first signal line S1 is a first metal line, while the second signal line S2 is a second metal line, both metal lines may be in any of the metal layers above the transistor 110.

The connections between the transistor 110 and the first signal line S1, and the second signal line S2 are made by placing vias to connect the first terminal DS1 and the second terminal DS2 of the transistor 110 to the first signal line S1, and the second signal line S2. As shown in FIG. 2(b), a via V1 connects the first terminal DS1 to the first signal line S1, while another via V2 connects the second terminal DS2 to the second signal line S2, corresponding to the schematic connections shown in FIG. 2(a).

FIG. 2(c) illustrates another layout implementing the schematic transistor 110 shown in FIG. 2(a). A via V1 connects the first terminal DS1 to the first signal line S1, while another via V2 connects the second terminal DS2 to the second signal line S2. The layout of the first terminal DS1 is at the top portion of the active area 120 in FIG. 2(b), while it is at the bottom portion of the active area 120 in FIG. 2(c). Other parts of FIG. 2(c) are similar to the corresponding parts in FIG. 2(b).

Figure 3A:
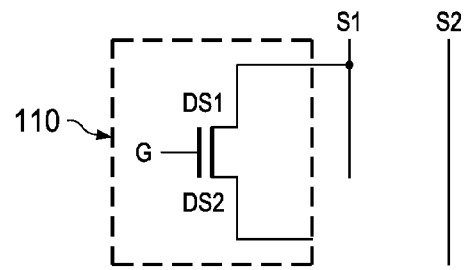
FIGS. 3(a)-3(b) illustrate an exemplary schematic and layout design of an inactive storage cell, in accordance with some embodiments.
Figure 3B:
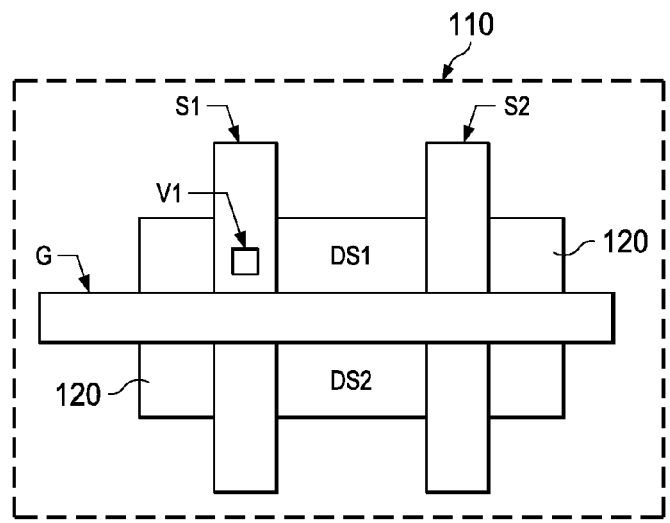

FIGS. 3(a) and 3(b) illustrate the transistor 110 as the storage cell 110 in the ROM device 110, as shown in FIG. 1(a), programmed into the inactive state, in accordance with some embodiments.

FIG. 3(a) illustrates a schematic design of the transistor 110 with the gate G, the first terminal DS1, and the second terminal DS2. The first terminal DS1 may be the source of the transistor 110 and the second terminal DS2 may be the drain of the transistor 110. On the other hand, the first terminal DS1 may be the drain of the transistor 110 and the second terminal DS2 may be the source of the transistor 110. The source and the drain of the transistor 110 are symmetric, and they can be placed as either side of the gate G of the transistor 110.

The first signal line S1 may be the bit line and the second signal line S2 may be the ground line, or the power line. On the other hand, the first signal line S1 may be the ground line, or the power line, and the second signal line S2 may be the bit line.

The transistor 110 is in the inactive state when the first terminal DS1 of the transistor 110 is connected to the first signal line S1, but the second terminal DS2 is not connected to the second signal line S2. When the transistor 110 is in the inactive state, there is no conductive path from the first signal line S1 through the transistor 110 to the second signal line S2. In general, the transistor 110 is in the inactive state when there is one connection between the first terminal DS1 of the transistor 110 with one of the first signal line S1 and the second signal line S2, but no connection between the second terminal DS2 of the transistor 110 with any of the first signal line S1 and the second signal line S2.

FIG. 3(b) illustrates a layout implementing the schematic transistor 110 shown in FIG. 3(a). An active area 120 comprises the first terminal DS1 and the second terminal DS2, where one of the first terminal DS1 and the second terminal DS2 is the source, and another is the drain of the transistor 110. The gate G is above the active area 120. The first signal line S1 and the second signal line S2 are metal lines in any of the metal layers above the transistor 110.

The via V1 connects the first terminal DS1 with the first signal line S1. However, no via connects the second terminal DS2 with the second signal line S2, therefore no conductive path exists from the first signal line S1 through the transistor 110 to the second signal line S2, and the transistor 110 is in the inactive state.

Figure 4A:
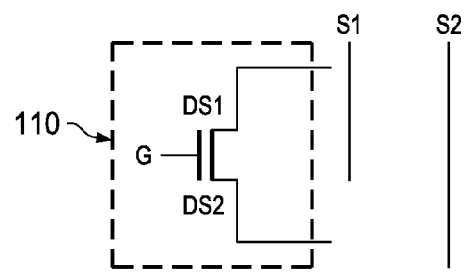
FIGS. 4(a)-4(b) illustrate an additional exemplary schematic and layout design of an inactive storage cell, in accordance with some embodiments.
Figure 4B:
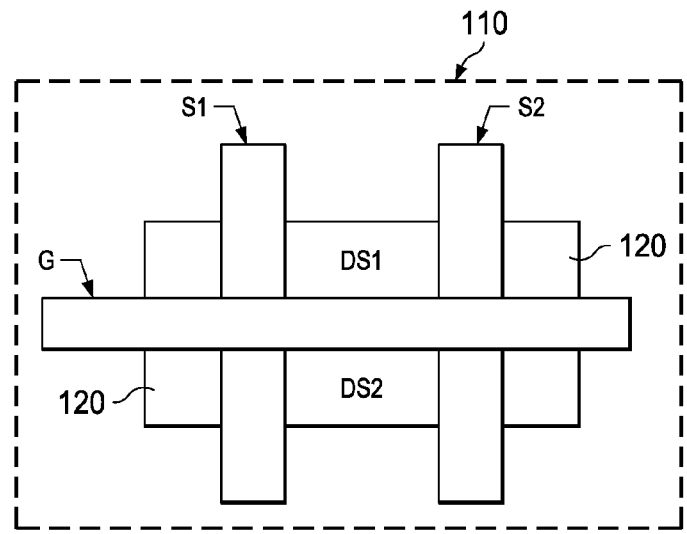

FIGS. 4(a) and 4(b) illustrate the transistor 110 as the storage cell 110 in the ROM device 100, as shown in FIG. 1(a), programmed into the inactive state, in accordance with some additional embodiments.

FIG. 4(a) illustrates a schematic design of the transistor 110 with the gate G, the first terminal DS1, and the second terminal DS2, where the details of each are similar to those described in FIG. 3(a). There is no connection between the first terminal DS1 of the transistor 110 with any of the first signal line S1 and the second signal line S2, and no connection between the second terminal DS2 of the transistor 110 with any of the first signal line S1 and the second signal line S2. Therefore the transistor 110 does not have a conductive path, and is in the inactive state.

FIG. 4(b) illustrates a layout implementing the schematic transistor 110 shown in FIG. 4(a). The active area 120 comprises the first terminal DS1 and the second terminal DS2, and the gate G above the active area 110. The first signal line S1 and the second signal line S2 are metal lines in any of the metal layers above the transistor 110. There is no via connecting the first terminal DS1 and the second terminal DS2 with any of the first signal line S1 and the second signal line S2, therefore no conductive path exists from the first signal line S1 through the transistor 110 to the second signal line S2, and the transistor 110 is in the inactive state.

Figure 5A:
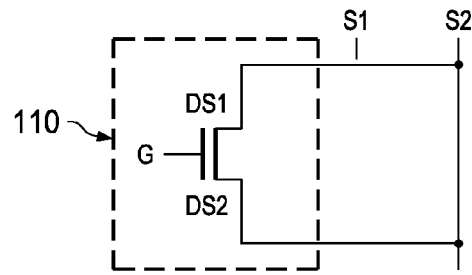
FIGS. 5(a)-5(b) illustrate a further additional exemplary schematic and layout design of an inactive storage cell, in accordance with some embodiments.
Figure 5B:
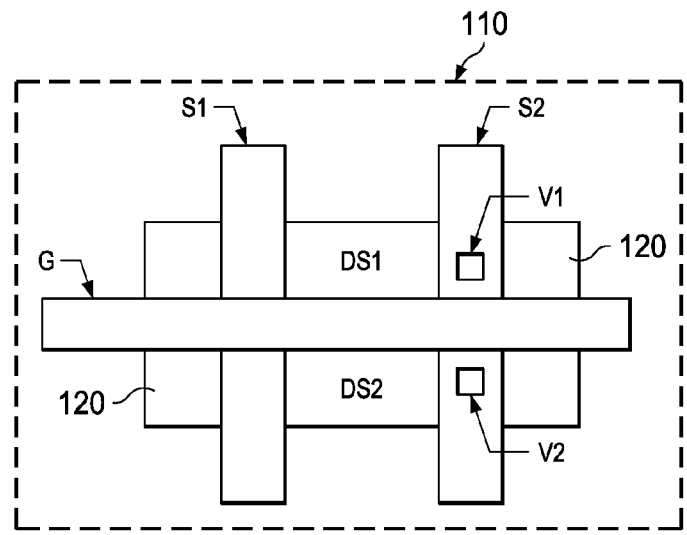

FIGS. 5(a) and 5(b) illustrate the transistor 110 as the storage cell 110 in the ROM device 100, as shown in FIG. 1(a), programmed into the inactive state, in accordance with further additional embodiments.

FIG. 5(a) illustrates a schematic design of the transistor 110 with the gate G, the first terminal DS1, and the second terminal DS2, where the details of each are similar to those described in FIG. 3(a). Both the first terminal DS1 and the second terminal DS2 are connected to a same second signal line S2, while no terminal is connected to the first signal line S1. Therefore the transistor 110 does not have a conductive path, and is in the inactive state. In general, the transistor 110 is in an inactive state when both the first terminal DS1 and the second terminal DS2 of the transistor 110 are connected to a same signal line of the first signal line S1 and the second signal line S2.

FIG. 5(b) illustrates a layout implementing the schematic transistor 110 shown in FIG. 5(a). The active area 120 comprises the first terminal DS1 and the second terminal DS2, and the gate G is above the active area 120. The first signal line S1 and the second signal line S2 are metal lines in any of the metal layers above the transistor 110. A via V1 connects the first terminal DS1 to the second signal line S2, and another via V2 connects the second terminal DS2 with the same second signal line S2. Therefore the transistor 110 does not have a conductive path, and is in the inactive state.

Figure 6A:
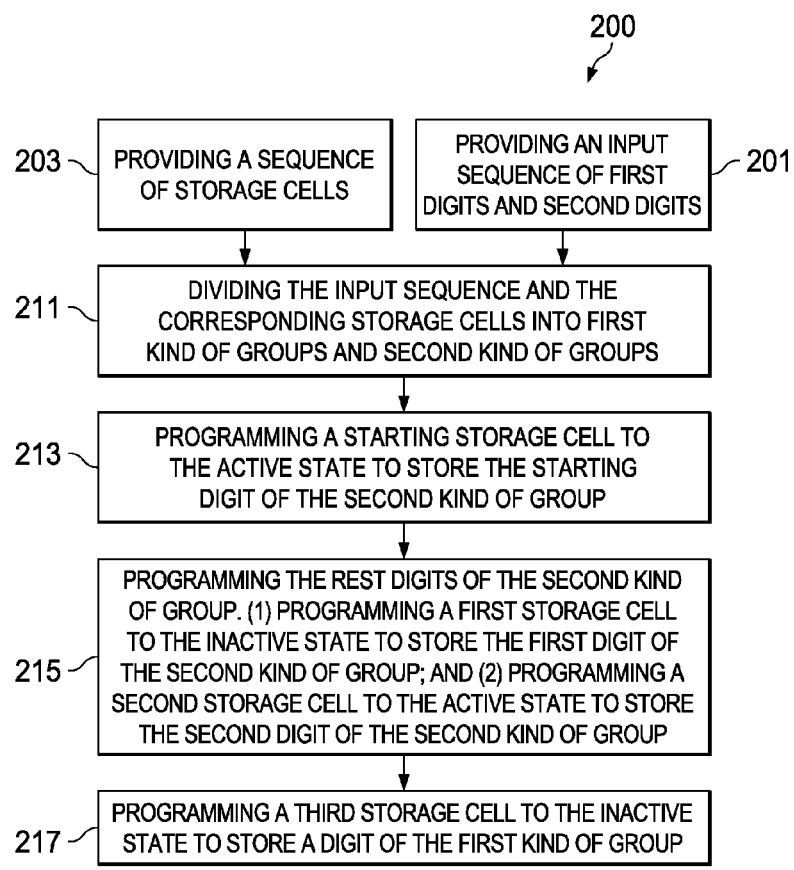
FIGS. 6(a)-6(g) illustrate an exemplary method and various layouts for storing a sequence of digits into a sequence of storage cells, in accordance with some embodiments.

FIGS. 6(a)-6(g) illustrate an exemplary method and various layouts for storing a sequence of digits into a sequence of storage cells, in accordance with some embodiments. A general method 200 is shown in FIG. 6(a), while FIGS. 6(b)-6(g) further illustrate steps of the method 200 shown in FIG. 6(a) in more details. Shown in FIG. 6(a), at step 211, the method 200 divides an input sequence and the corresponding storage cells into first kind of groups and second kind of groups, while the second kind of group has a starting digit. At step 213, the method 200 continues by programming a starting storage cell to store the starting digit of the second kind of group. At step 215, the method 200 programs the rest digit of the second kind of group. Finally at step 217, the method 200 programs the digits of the first kind of group. More details are shown below.

As illustrated in FIG. 6(a), at step 201, an input sequence of first digits and second digits is provided to the method 200, wherein the first digit may be 0 and the second digit may be 1, or the first digit may be 1 and the second digit may be 0. For example, assuming the first digit is 0, and the second digit is 1, an input sequence I1=101101001101101100101 may be provided. In the following descriptions, examples are used to demonstrate the operations when the first digit is 0 and the second digit is 1. However, similar examples may be constructed to demonstrate the operations when the first digit is 1 and the second digit is 0. Here the terms "first digit" and the "second digit" do not mean the digit's position in the input sequence, instead it is the two digits used to form the input sequence. All digits in the input sequence is either the first digit or the second digit.

At step 203, a sequence of storage cells is provided. There may be a same number of storage cells as the number of digits in the input sequence so that each digit can be stored in a corresponding storage cell. The storage cell may have an active state and an inactive state to store the first digit and the second digit respectively. The first digit may be stored as the inactive state.

Figure 6B:
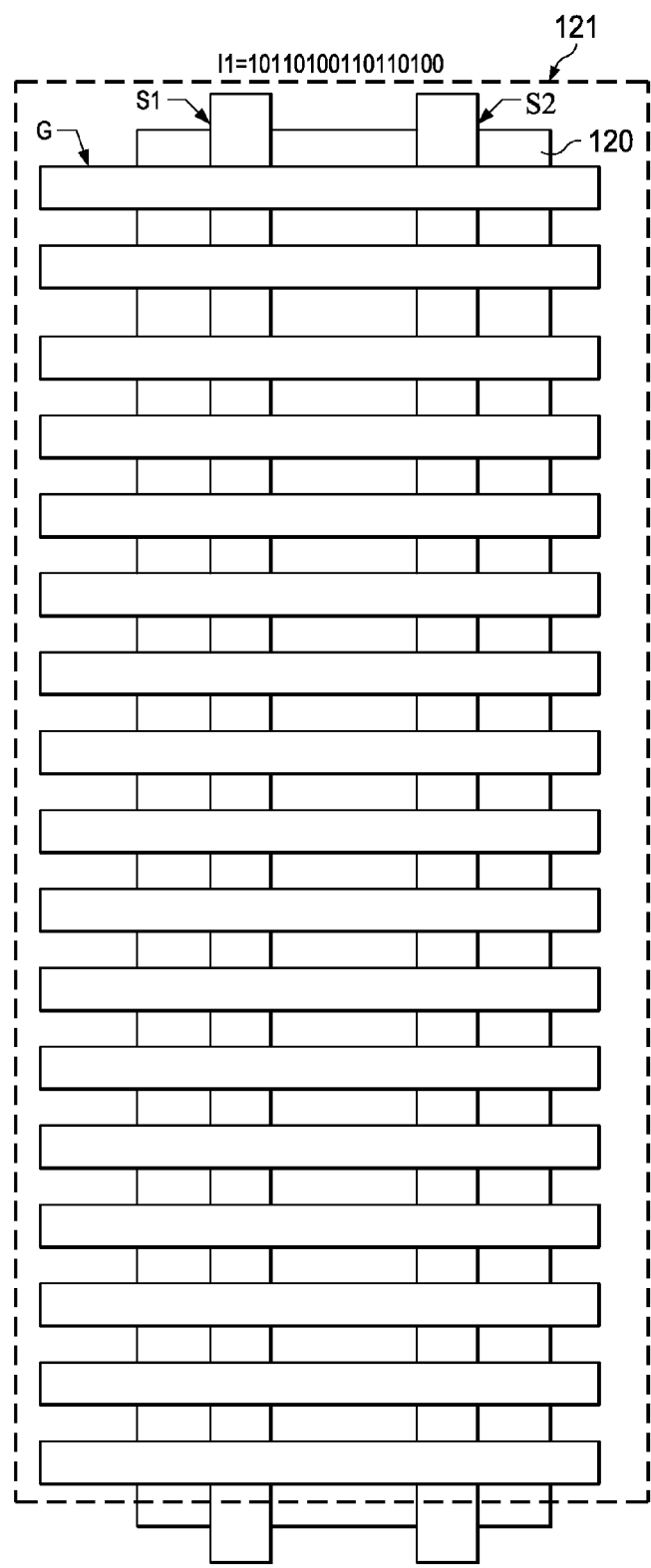
Figure 6C:
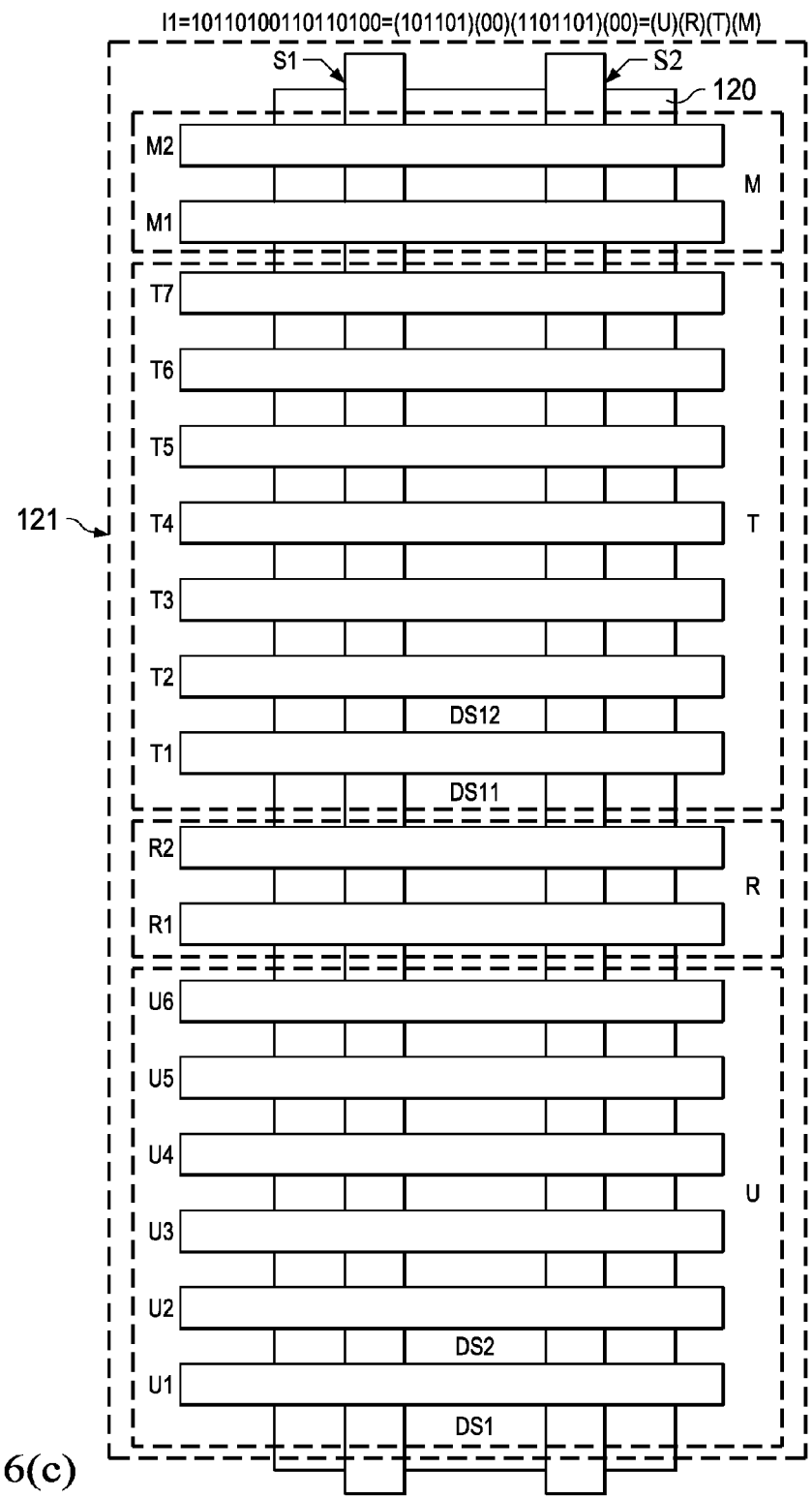

Step 201 and step 203 are further illustrated in FIG. 6(b), where the input sequence and the sequence of storage cells are shown. The input sequence I1=10110100110110100101 is provided according to step 201. The sequence of transistors 121 is provided according to step 203, to act as the sequence of storage cells. The sequence of transistors 121 is formed within the continuous active area 120. A transistor has a first terminal and a second terminal, which may be the source and the drain of the transistor formed within the active area 120. Each transistor has a gate G over a channel between the two terminals. Two adjacent transistors share a terminal. The gates for the sequence of transistors 121 are routed in parallel. The input sequence I1 may be stored in a top to bottom way or from the bottom to top way in the sequence of transistors 121.

The first signal line S1 and the second signal line S2 are metal lines formed in parallel in a metal layer above the gates of the transistors, and routed in a direction perpendicular to the plurality of gates of the sequence of transistors 121. The first signal line S1 and the second signal line S2 will be connected to the terminals of the transistors by vias placed between the terminals of the transistors, the first signal lines S1 and the second signal line S2, to program the transistors into the active state or the inactive state, using techniques demonstrated in FIGS. 2(*a*)-2(*c*), FIGS. 3(*a*)-3(*b*), FIGS. 4(*a*)-4(*b*), and FIGS. 5(*a*)-5(*b*).

Referring back to FIG. 6(*a*) for the method 200, at step 211, the method 200 divides the input sequence into a collection of first kind of groups and second kind of groups. A first kind of group comprises a plurality of consecutive first digits. The first digit may be 0 or 1. Two first kind of groups are separated by a second kind of group. The second kind of group comprises consecutive digits without any consecutive first digits. The second kind of group has a starting digit which is the second digit. A group of consecutive digits is the second kind of group if it is not the first kind of group. The second kind of group may be at the beginning or at the end of the input sequence.

For example, the input sequence I1=10110100110110100101 may be divided into a collection of first kind of groups and second kind of groups as I1=10110100110110100101=(101101)(00) (1101101)(00) (101)=(U)(R)(T)(N)(M), where U=101101, R=00, T=1101101, N=00, and M=101 are groups of the input sequence I1. The R and N are first kind of groups comprising a plurality of consecutive 0s, while U, T, and M are second kind of groups. The second kind of group T is between the first kind of group R and the first kind of group N. The second kind of group U is at the beginning of the input sequence I1. The second kind of group M is at the end of the input sequence I1. The second kind of groups U, T, and M comprise consecutive digits without any consecutive first digit 0s. The second kind of groups U, T, and M have a starting digit which is the second digit 1.

Similarly, as shown in FIG. 6(*c*), the sequence of transistors 121 is divided into groups of consecutive transistors U, R, T, N, and M, corresponding to the groups of the input sequence I1. The group notation U, R, T, N, and M may be used to refer to the group of digits in the input sequence I1, or refer to the groups of consecutive transistor storing the group of digits. The groups of consecutive transistors U, T, and M are second kind of groups of consecutive transistors since they store the second kind of groups U, T, and M, of the input sequence. The second kind of group of consecutive transistors U, T, and M have a starting transistor U1, T1, and M1, storing the starting digit of the second kind of groups U, T, and M respectively. The groups of consecutive transistors R and N are first kind of groups of consecutive transistors since they store the first kind of group R and the first kind of group N.

Referring back to FIG. 6(*a*), at step 213, the method 200 programs the starting storage cell, which is the starting transistor, to the active state to store the starting digit of the second kind of group. The method 200 programs the first terminal of the starting transistor to connect to the first signal line S1 or the second signal line S2, depending on the properties of the second kind of group, wherein the properties of the second kind of group may be decided by a first number, a second number, and a third number of the second kind of group, which are all related to an assigned consecutive position numbers to the second digit is of the second kind of group.

For the example shown in FIG. 6(*c*), the starting transistor T1 of the second kind of group of consecutive transistors T has the first terminal DS11 which is a terminal of the starting transistor T1 not shared with any other transistors within the second kind of group of consecutive transistors T. The starting transistor T1 is in the active state when the first terminal DS11 is connected to one of the first signal line S1 and the second signal line S2, and the second terminal DS12 is connected to another of the first signal line S1 and the second signal line S2. The method 200 may decide to connect the first terminal DS11 of the starting transistor T1 to the first signal line S1 or the second signal line S2. Similarly, the method 200 may decide to connect the first terminal DS1 of the starting transistor U1 for the second kind of group of consecutive transistors U to the first signal line S1 or the second signal line S2. Furthermore, the method 200 may decide to connect the first terminal DS21 of the starting transistor M1 for the second kind of group of consecutive transistors M to the first signal line S1 or the second signal line S2.

In order to program the starting transistor T1, to store the starting digit of the second kind of group T, a consecutive position number is assigned to the second digit is in the second kind of group T. For the second of group T=1101101, the first 1 is assigned a first position T1, the second 1 is assigned a second position T2, and the rest is are similarly assigned as T3, T4, and T5. The 0s in the second kind of group T=1101101 are all assigned as T0. Similarly the corresponding transistors may be assigned a consecutive position numbers T1 to T5 as well, as shown in FIG. 6(*c*). For the second kind of group U, the position number for the second digit 1 are assigned as U1, U2, U3, and U4. Similarly the corresponding transistors may be assigned a consecutive position numbers U1 to U4 as well, as shown in FIG. 6(*c*). For the second kind of group M, the position number for the second digit 1 are assigned as M1 and M2. Similarly the corresponding transistors may be assigned a consecutive position numbers M1 to M2 as well, as shown in FIG. 6(*c*). A similar position number may be assigned to digits in the first kind of groups such as the first kind of group R and the first kind of group N, and to their corresponding transistors R1, R2, N1, and N2, as shown in FIG. 6(*c*), although in some embodiments, such position numbers may not be needed for the first kind of groups.

For the second kind of group T=1101101, the first number of the group T is one if there are an odd number of is in the second kind of group T, otherwise, the first number of the second kind of group T is zero. There are total five 1s (T1T2T3T4T5) in the second kind of group T, which is an odd number, therefore the first number for the second kind of group T is 1. By the similar reason, the first number of the second kind of group U=101101 is 0 since there are total 4 1s (U1U2U3U4) in the second kind of group U, and the first number of the second kind of group M=101 is 0 since there are total 2 1s (M1M2) in the second kind of group M.

The second number of the second kind of group T=1101101 is a number of the first digits 0s within the second kind of group T which are after an odd position number 1s. As shown above, the second kind of group T has no 0 after T1, T3 or T5. Therefore the second number of the second kind of group T is 0. Similarly, the second number of the second kind of group U=101101 is 2 since there is an 0 after U1=1, and another 0 after U3=1, and the second number of the second kind of group M=101 is 1 since there is an 0 after M1=1.

The third number of the second kind of group T=1101101 is the number of the first digits 0s within the second kind of group T which are after an even position number 1s. For the second kind of group T, there is a 0 that is after T2=1, another 0 that is after T4=1. Therefore the third number for the second kind of group T is 2. Similarly, the third number of the second kind of group U=101101 is 0 since there is no 0 that is after an even numbered 1, and the third number of the second kind of group M=101 is 0 since there is no 0 that is after an even numbered 1.

Figure 6D:
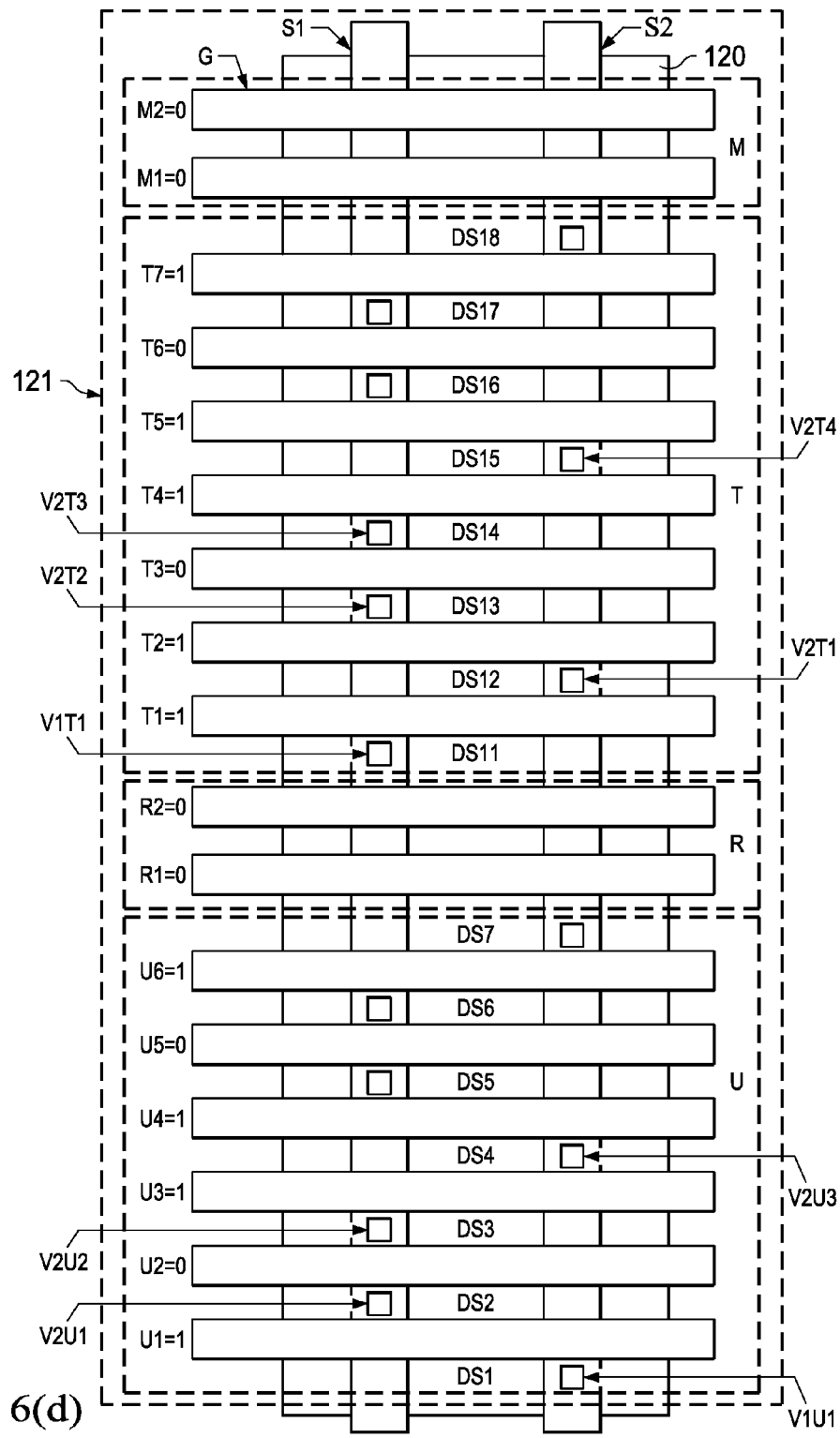
Figure 6E:
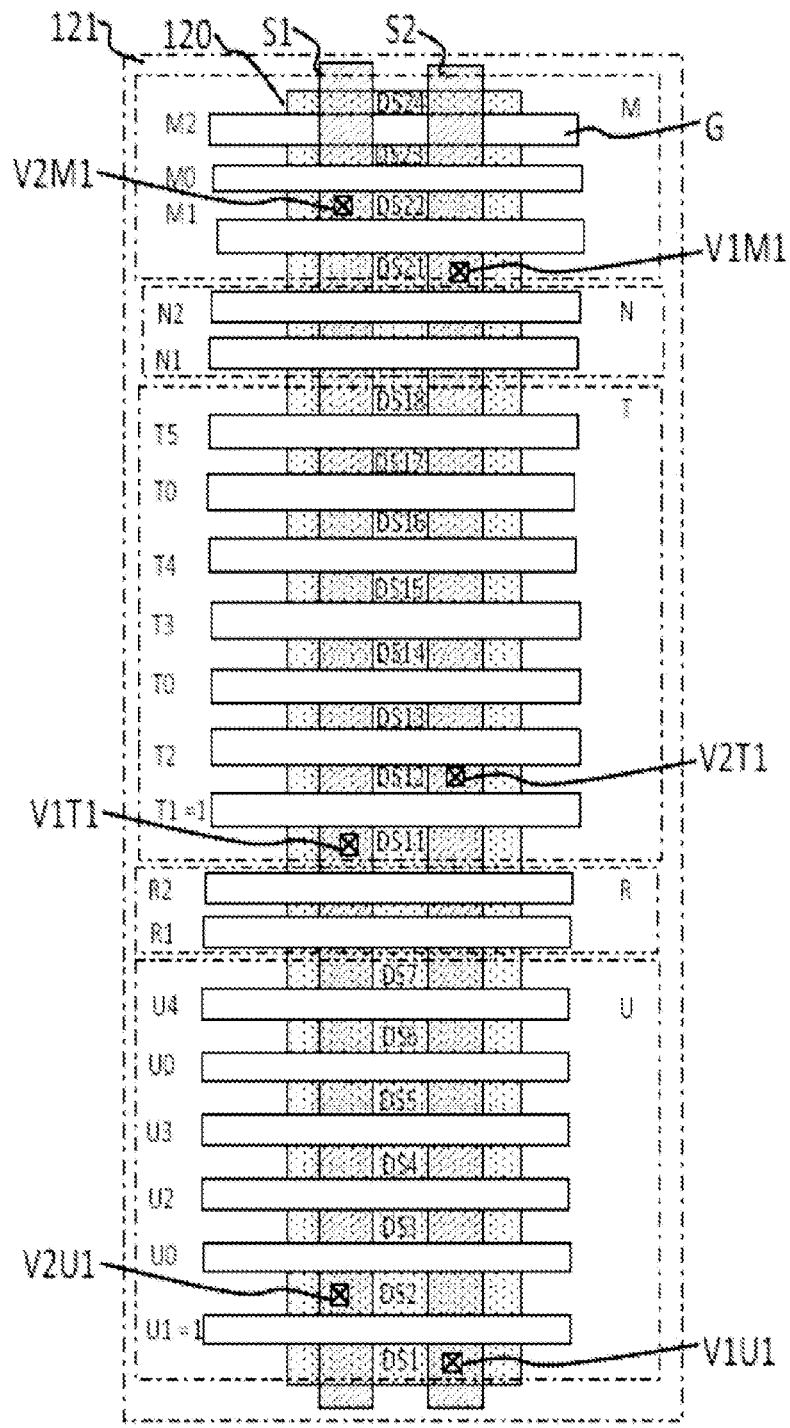

As shown in FIGS. 6(d) and 6(e), the above first number, the second number, and the third number of the second kind of group T=1101101 can be used to programming the staring transistor T1 of the second kind of group T to the active state, by deciding the connection between the first terminal DS11 of the starting transistor T1 connected to the first signal line S1 or the second signal line S2.

For the second kind of group T, the first number is 1, the second number is 0, and the third number is also 2, therefore the first number 1 is less than the third number minus the second number plus 1, which results in 2−0+1=3. When the first number is less than the third number minus the second number plus 1, the first terminal DS11 of the starting transistor T1 is connected to the first signal line S1 by a via V1T1, and another via V2T1 connects the second terminal DS12 with the second signal line S2, as shown in FIGS. 6(d) and 6(e).

On the other hand, if the first number is greater than the third number minus the second number plus 1, the first terminal of the starting transistor is connected to the second signal line S2, and the second terminal is connected to the first signal line S1. For example, for the group U, the first number is 0, the second number is 2, and the third number is also 0, the first number 0 is bigger than the third number 0 minus the second number 2 plus 1, which is 0−2+1=−1. Therefore the first terminal DS1 of the starting transistor U1 is connected to the second signal line S2 by a via V1U1, and another via V2U1 connects the second terminal DS2 with the first signal line S1, as shown in FIGS. 6(d) and 6(e).

Furthermore, if the first number is equal to the third number minus the second number plus 1, the first terminal of the starting transistor may be connected to either the second signal line S2, or the first signal line S1. For example, for the group M, the first number is 0, the second number is 1, and the third number is also 0, the first number 0 is equal to the third number 0 minus the second number 1 plus 1, which is 0−1+1=0. Therefore the first terminal DS21 of the starting transistor M1 may be connected to the first signal line S1 by an via V1M1, and another via V2M1 connects the second terminal DS22 with the second signal line S2, as shown in FIG. 6(d). Alternatively, first terminal DS21 of the starting transistor M1 may be connected to the second signal line S2 by an via V1M1, and another via V2M1 connects the second terminal DS22 with the first signal line S1, as shown in FIG. 6(e).

Referring back to FIG. 6(a), at step 215, after the starting digit of the second kind of group is programmed, the method 200 continues to program the rest digits of the second kind of group. The method 200 programs a first storage cell to the inactive state to store the first digit, and programs a second storage cell to the active state to store the second digit of the second kind of group. The programming is performed one transistor at a time according to the position of the transistor in the sequence. At step 213 as shown above, the starting transistor at position one has been programmed. At step 215, the first transistor to be programmed is the transistor next to the starting transistor.

Figure 6F:
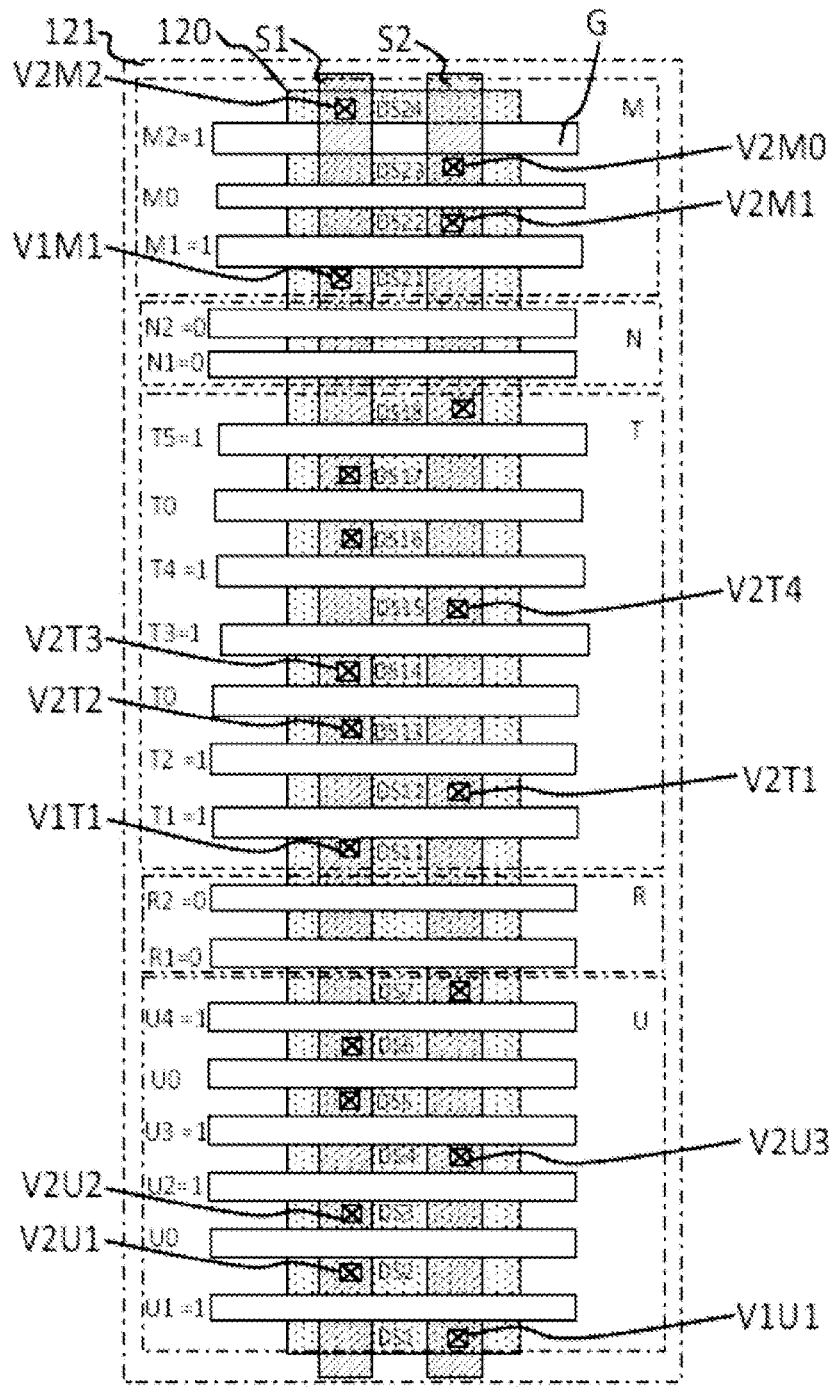
Figure 6G:
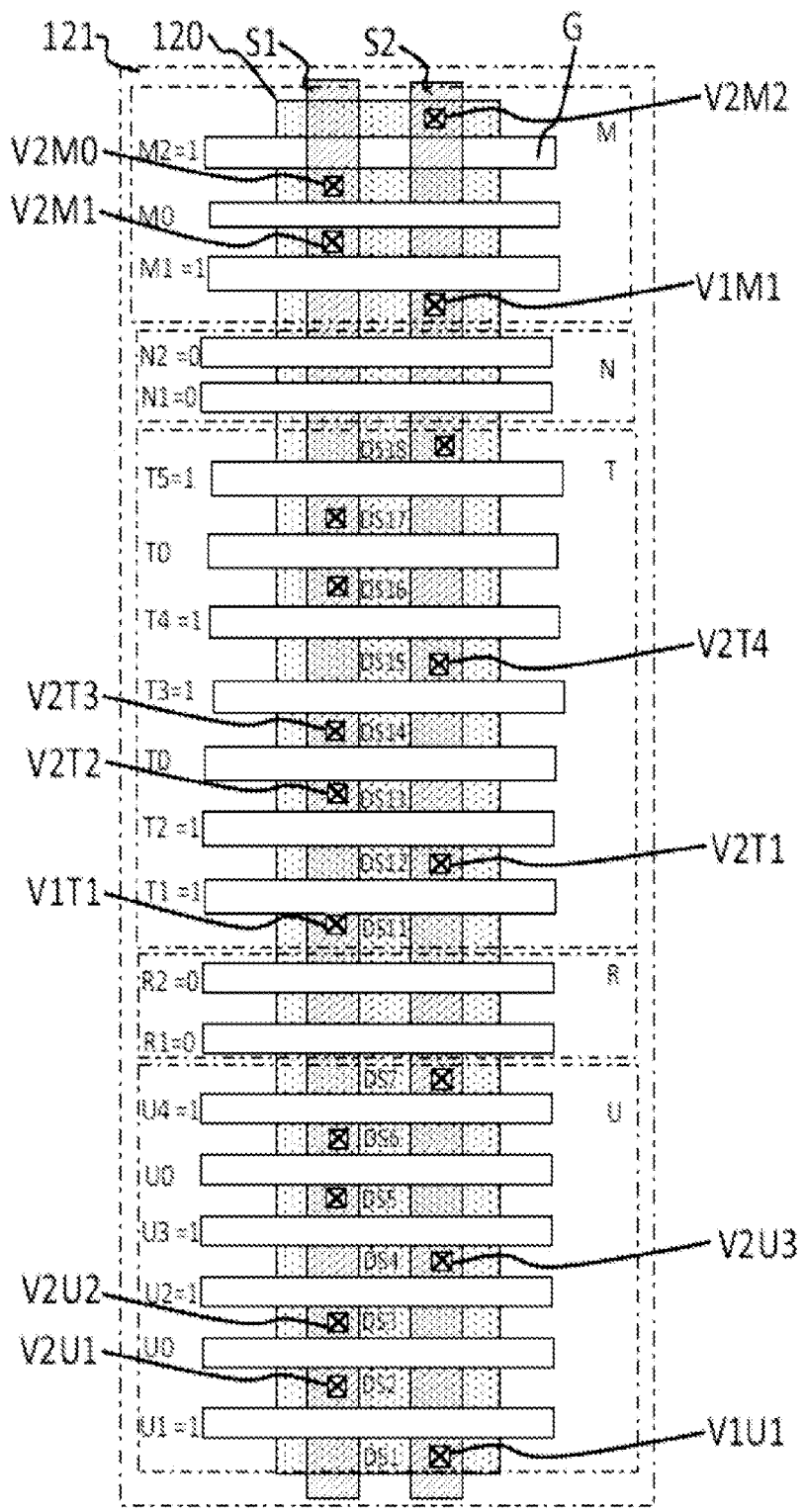

As illustrated in FIGS. 6(f) and 6(g), for the second kind of group of consecutive transistors T, in order to program the transistor T2 to store the digit 1, the method 200 determines a signal line connected to the first terminal DS12 of the transistor T2. A preceding transistor of the transistor T2 is the transistor immediately before the transistor T2. The transistor T2 has the preceding transistor T1. The first terminal DS12 of the transistor T2 is a same terminal shared with the second terminal DS12 of the preceding transistor T1. Since the preceding transistor T1 has been programmed, the shared terminal DS12 is connected to the second signal line S2 by via V2T1. The method 200 makes a via connection V2T2 at the second terminal DS13 of the transistor T2 to the first signal line S1, so that the first terminal DS12 of the transistor T2 and the second terminal DS13 of the transistor T2 are connected to two different signal lines, and the transistor T2 is in the active state.

On the other hand, for the transistor T0 next to the transistor T2 which has just been programmed, the method 200 programs the transistor T0 into the inactive state to store the digit 0. The method 200 determines a signal line connected to the first terminal DS13 of the transistor T0. The transistor T0 has the preceding transistor T2. The first terminal DS13 of the transistor T0 is a same terminal shared with the second terminal DS13 of the preceding transistor T2. Since the preceding transistor T2 has been programmed, the second terminal DS13 of the transistor T2 is connected to the first signal line S1 by via V2T2. The method 200 makes a via connection V2T3 at the second terminal DS14 of the transistor T0 to the first signal line S1, so that the first terminal DS13 of the transistor T0 and the second terminal DS14 of the transistor T0 are connected to a same first signal line S1, therefore the transistor T0 is in the inactive state.

The rest of the transistors T3, T4, T0, and T5 can be similarly programmed one at a time for the digits T3=1, T4=1, 0, and T5=1. The second terminal DS15 of the transistor T3=1 is connected by the via V2T4 to the second signal line S2 so that the first terminal DS14 of the transistor T3 and the second terminal DS15 of the transistor T3 are connected to two different signal lines to store the digit 1. The second terminal DS16 of the transistor T4 is connected to the first signal line S1 so that the first terminal DS15 of the transistor T4 and the second terminal DS16 of the transistor T4 are connected to two different signal lines to store the digit 1. Similar programming can be performed for the rest transistors in the T group, the U group, and the M group, as shown in FIGS. 6(f) and 6(g).

Referring back to FIG. 6(a), at step 217, after finishing programming the second kind of groups, the method 200 programs corresponding transistors to the inactive state to store a digit of a first kind of group. Each digit in the first kind of group is the first digit, and each digit in the first kind of group is stored to the inactive state.

As shown in FIGS. 6(f) and 6(g), the transistor for the first kind of groups R and N has no additional via connection for the transistor R1, R2, or N1, N2. The transistor R1 has one via connection to the second signal line S2, which is shared with the transistor U4 in the second kind of group U. The transistor R2 has one via connection to the first signal line S1, which is shared with the transistor T1 in the second kind of group T. Neither R1 nor R2 has any additional via connection to the first signal line S1 and the second signal line S2. Similarly, the transistor N1 has a terminal DS18 shared with the transistor T5, which is connected to the second signal line S2. While the transistor N2 has a via connection to the first signal line S1 shown in FIG. 6(f) or to the second signal line S2 shown in FIG. 6(g), which is a terminal shared with the transistor M1 in the second kind of group M. By adding no via connection to the transistors corresponding to the first kind of group, the transistors do not have the first terminal and the second terminal connected to two different signal lines, therefore the transistors are in the inactive state.

A method for programming a read only memory (ROM) device is disclosed. The method comprises: providing an input sequence of first digits and second digits; providing a sequence of storage cells, wherein a storage cell stores a digit of the input sequence to an active state or an inactive state of the storage cell; dividing the input sequence into a first kind of groups of the input sequence and a second kind of groups of the input sequence, wherein a first kind of group of the input sequence comprises a plurality of consecutive first digits, two first kind of groups of the input sequence are separated by a second kind of group of the input sequence, the second kind of group of the input sequence comprises consecutive digits without any consecutive first digits, and the second kind of group of the input sequence has a starting digit which is the second digit; and programming a starting storage cell to the active state to store the starting digit of the second kind of group of the input sequence.

A read only memory (ROM) device is disclosed. The ROM device comprises a sequence of storage cells, wherein a storage cell stores a digit of an input sequence of first digits and second digits to an active state or an inactive state of the storage cell. The sequence of storage cells is divided into a first kind of group of consecutive storage cells and a second kind of group of consecutive storage cells. The first kind of group of consecutive storage cells store a first kind of group of the input sequence, and the second kind of group of consecutive storage cells store a second kind of group of the input sequence, wherein the first kind of group of the input sequence comprises a plurality of consecutive first digits, two first kind of groups of the input sequence are separated by the second kind of group of the input sequence, the second kind of group of the input sequence comprises consecutive digits without any consecutive first digits, and the second kind of group of the input sequence has a starting digit which is the second digit. A starting storage cell of the second kind of group of consecutive storage cells is in the active state storing the starting digit of the second kind of group of the input sequence.

A read only memory (ROM) device is disclosed. The ROM device comprises a first signal line and a second signal line. The ROM device further comprises a continuous active area with a sequence of transistors. A transistor has a first terminal and a second terminal formed within the continuous active area to store a digit of an input sequence of first digits and second digits, and the first terminal of the transistor is a same terminal shared as the second terminal of a preceding transistor of the transistor. The sequence of transistors is divided into a first kind of group of consecutive transistors corresponding to a first kind of group of the input sequence, and a second kind of group of consecutive transistors corresponding to a second kind of group of the input sequence. The first kind of group of the input sequence comprises a plurality of consecutive first digits, two first kind of groups of the input sequence are separated by the second kind of group of the input sequence, the second kind of group of the input sequence comprises consecutive digits without any consecutive first digits, and the second kind of group of the input sequence has a starting digit which is the second digit. A starting transistor of the second kind of group of consecutive transistors is in the active state and stores the starting digit of the second kind of group of the input sequence. The starting transistor does not have a preceding transistor within the second kind of group of consecutive transistors. The first terminal of the starting transistor is a terminal of the starting transistor not shared with any other transistors within the second kind of group of consecutive transistors.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for programming a read only memory (ROM) device, comprising:
   providing an input sequence of first digits and second digits;
   providing a sequence of storage cells, wherein a storage cell stores a digit of the input sequence to an active state or an inactive state of the storage cell;
   dividing the input sequence into a first kind of groups of the input sequence and a second kind of groups of the input sequence, wherein a first kind of group of the input sequence comprises a plurality of consecutive first digits, two first kind of groups of the input sequence are separated by a second kind of group of the input sequence, the second kind of group of the input sequence comprises consecutive digits without any consecutive first digits, and the second kind of group of the input sequence has a starting digit which is the second digit; and
   programming a starting storage cell to the active state to store the starting digit of the second kind of group of the input sequence.

2. The method of claim 1, further comprising:
   programming a first storage cell to the inactive state to store the first digit of the second kind of group of the input sequence; and
   programming a second storage cell to the active state to store the second digit of the second kind of group of the input sequence.

3. The method of claim 2, further comprising:
   programming a third storage cell to the inactive state to store a digit of the first kind of group of the input sequence.

4. The method of claim 3, wherein the storage cell is a transistor with a first terminal and a second terminal.

5. The method of claim 4, further comprising:
providing a first signal line and a second signal line, wherein:
programming the transistor of the first storage cell to the inactive state to store the first digit comprises:
making no connection between the first terminal of the transistor with any of the first signal line and the second signal line, and no connection between the second terminal of the transistor with any of the first signal line and the second signal line; or
making one of the first terminal and the second terminal of the transistor connected to one of the first signal line and the second signal line, while another of the first terminal and the second terminal of the transistor not connected to any of the first signal line and the second signal line; or
making both the first terminal and the second terminal of the transistor connected to a same signal line of the first signal line and the second signal line.

6. The method of claim 5, wherein the first signal line is a bit line and the second signal line is a ground line, or the first signal line is the bit line and the second signal line is the ground line.

7. The method of claim 4, further comprising:
providing a first signal line and a second signal line, wherein:
programming the transistor of the second storage cell to the active state to store the second digit comprises:
making one connection between the first terminal of the transistor with one of the first signal line and the second signal line; and
making another connection between the second terminal of the transistor with another of the first signal line and the second signal line.

8. The method of claim 1, further comprising:
providing a first signal line and a second signal line;
providing a sequence of transistors formed within a continuous active area to be the sequence of storage cells, wherein:
the storage cell comprises a transistor with a first terminal and a second terminal;
the first terminal of the transistor is a same terminal shared as the second terminal of a preceding transistor of the transistor;
the sequence of transistors is divided into a first kind of group of consecutive transistors corresponding to the first kind of group of the input sequence, and a second kind of group of consecutive transistors corresponding to the second kind of group of the input sequence;
a starting transistor as the starting storage cell for the starting digit of the second kind of group of the input sequence does not have the preceding transistor within the second kind of group of consecutive transistors; and
the first terminal of the starting transistor is a terminal of the starting transistor not shared with any other transistors within the second kind of group of consecutive transistors; and
programming the starting transistor to the active state to store the starting digit of the second kind of group of the input sequence comprises:
deciding a first number to be one if there are an odd number of second digits in the second kind of group of the input sequence, otherwise, deciding the first number to be zero;
assigning a consecutive position number to each second digit in the second kind of group of the input sequence while the starting digit is assigned one as the position number;
deciding a second number to be a number of the first digits within the second kind of group of the input sequence which are after a second digit with an odd position number;
deciding a third number to be a number of the first digits within the second kind of group of the input sequence which are after a second digit with an even position number; and
making one via connection between the first terminal of the starting transistor with the first signal line and another via connection between the second terminal of the starting transistor with the second signal line, when the first number is less than the third number minus the second number plus one;
making one via connection between the first terminal of the starting transistor with the second signal line, and another via connection between the second terminal of the starting transistor with the first signal line, when the first number is bigger than the third number minus the second number plus one; or
making one via connection between the first terminal of the starting transistor with one of the first signal line and the second signal line, and another via connection between the second terminal of the starting transistor with another of the first signal line and the second signal line, when the first number is equal to the third number minus the second number plus one.

9. The method of claim 8, further comprising:
programming a first transistor to the inactive state to store the first digit of the second kind of group of the input sequence comprises:
determining a first shared signal line connected to the first terminal of the first transistor, wherein the first terminal of the first transistor is a same terminal shared with the second terminal of the preceding transistor of the first transistor; and
connecting the second terminal of the first transistor to the first shared signal line.

10. The method of claim 9, further comprising:
programming a second transistor to the active state to store the second digit of the second kind of group of the input sequence comprises:
determining a second shared signal line connected to the first terminal of the second transistor, wherein the first terminal of the second transistor is a same terminal shared with the second terminal of the preceding transistor of the second transistor; and
connecting the second terminal of the second transistor to a signal line different from the second shared signal line.

11. The method of claim 10, further comprising:
programming the first kind of group of consecutive transistors to the inactive state by making no additional via connection between any terminal of any transistor of the first kind of group of consecutive transistors with any of the first signal line and the second signal line.

12. The method of claim 8, wherein the first terminal is a source of the transistor and the second terminal is a drain of the transistor, or the first terminal is the drain of the transistor and the second terminal is the source of the transistor.

13. The method of claim 1, wherein the first digit is 0 and the second digit is 1, or the first digit is 1 and the second digit is 0.

14. A read only memory (ROM) device, comprising:
a sequence of storage cells, wherein a storage cell stores a digit of an input sequence of first digits and second digits to an active state or an inactive state of the storage cell;
a first kind of group of consecutive storage cells corresponding to a first kind of group of the input sequence, and a second kind of group of consecutive storage cells corresponding to a second kind of group of the input sequence, wherein the first kind of group of the input sequence comprises a plurality of consecutive first digits, two first kind of groups of the input sequence are separated by the second kind of group of the input sequence, the second kind of group of the input sequence comprises consecutive digits without any consecutive first digits, and the second kind of group of the input sequence has a starting digit which is the second digit; and
an active starting storage cell of the second kind of group of consecutive storage cells storing the starting digit of the second kind of group of the input sequence.

15. The device of claim 14, further comprising:
a first inactive storage cell to store the first digit of the second kind of group of the input sequence;
an active storage cell to store the second digit of the second kind of group of the input sequence; and
a second inactive storage cell to store a digit of the first kind of group of the input sequence.

16. The device of claim 14, further comprising:
a first signal line and a second signal line;
a sequence of transistors formed within a continuous active area to be the sequence of storage cells, wherein:
the storage cell comprises a transistor with a first terminal and a second terminal;
the first terminal of the transistor is a same terminal shared as the second terminal of a preceding transistor of the transistor;
the sequence of transistors is divided into a first kind of group of consecutive transistors corresponding to the first kind of group of the input sequence, and a second kind of group of consecutive transistors corresponding to the second kind of group of the input sequence;
a starting transistor for the starting digit of the second kind of group of the input sequence does not have the preceding transistor within the second kind of group of consecutive transistors; and
the first terminal of the starting transistor is a terminal of the starting transistor not shared with any other transistors within the second kind of group of consecutive transistors; and
a via connection between the first terminal of the starting transistor with the first signal line and another via connection between the second terminal of the starting transistor with the second signal line, when a first number is less than a third number minus a second number plus one;
a via connection between the first terminal of the starting transistor with the second signal line, and another via connection between the second terminal of the starting transistor with the first signal line, when the first number is bigger than the third number minus the second number plus one; or
a via connection between the first terminal of the starting transistor with one of the first signal line and the second signal line, and another via connection between the second terminal of the starting transistor with another of the first signal line and the second signal line, when the first number is equal to the third number minus the second number plus one; wherein:
the first number is one if there are an odd number of second digits in the second kind of group of the input sequence, otherwise, the first number is zero;
each second digit in the second kind of group of the input sequence is assigned a consecutive position number while the starting digit is assigned one as the position number;
the second number is a number of the first digits within the second kind of group of the input sequence which are after a second digit with an odd position number; and
the third number is a number of the first digits within the second kind of group of the input sequence which are after a second digit with an even position number.

17. The device of claim 16, wherein:
a first transistor of the second kind of group of consecutive transistors is in the inactive state to store the first digit of the second kind of group of the input sequence;
a first shared signal line is connected to the first terminal of the first transistor, wherein the first terminal of the first transistor is a same terminal shared with the second terminal of the preceding transistor of the first transistor; and
the second terminal of the first transistor is connected to the first shared signal line.

18. The device of claim 16, wherein:
a second transistor of the second kind of group of consecutive transistors is in the active state to store the second digit of the second kind of group of the input sequence;
a second shared signal line is connected to the first terminal of the second transistor, wherein the first terminal of the second transistor is a same terminal shared with the second terminal of the preceding transistor of the second transistor; and
the second terminal of the second transistor is connected to a signal line different from the second shared signal line.

19. A read only memory (ROM) device, comprising:
a first signal line and a second signal line;
a continuous active area with a sequence of transistors, wherein:
a transistor has a first terminal and a second terminal formed within the continuous active area to store a digit of an input sequence of first digits and second digits;
the first terminal of the transistor is a same terminal shared as the second terminal of a preceding transistor of the transistor;
the sequence of transistors is divided into a first kind of group of consecutive transistors corresponding to a first kind of group of the input sequence, and a second kind of group of consecutive transistors corresponding to a second kind of group of the input sequence; and
the first kind of group of the input sequence comprises a plurality of consecutive first digits, two first kind of groups of the input sequence are separated by the second kind of group of the input sequence, the second kind of group of the input sequence comprises consecutive digits without any consecutive first digits, and the second kind of group of the input sequence has a starting digit which is the second digit;
a starting transistor storing the starting digit of the second kind of group of the input sequence, wherein:

the starting transistor does not have the preceding transistor within the second kind of group of consecutive transistors; and the first terminal of the starting transistor is a terminal of the starting transistor not shared with any other transistors within the second kind of group of consecutive transistors; and a via connection between the first terminal of the starting transistor with the first signal line and another via connection between the second terminal of the starting transistor with the second signal line, when a first number is less than a third number minus a second number plus one;

a via connection between the first terminal of the starting transistor with the second signal line, and another via connection between the second terminal of the starting transistor with the first signal line, when the first number is bigger than the third number minus the second number plus one; or a via connection between the first terminal of the starting transistor with one of the first signal line and the second signal line, and another via connection between the second terminal of the starting transistor with another of the first signal line and the second signal line, when the first number is equal to the third number minus the second number plus one; wherein:

the first number is one if there are an odd number of second digits in the second kind of group of the input sequence, otherwise, the first number is zero;

each second digit in the second kind of group of the input sequence is assigned a consecutive position number while the starting digit is assigned one as the position number;

the second number is a number of the first digits within the second kind of group of the input sequence which are after a second digit with an odd position number; and the third number is a number of the first digits within the second kind of group of the input sequence which are after a second digit with an even position number.

20. The device of claim 19, wherein:

a first transistor of the second kind of group of consecutive transistors is in an inactive state to store the first digit of the second kind of group of the input sequence;

a first shared signal line is connected to the first terminal of the first transistor, wherein the first terminal of the first transistor is a same terminal shared with the second terminal of the preceding transistor of the first transistor; and the second terminal of the first transistor is connected to the first shared signal line;

a second transistor of the second kind of group of consecutive transistors is in an active state to store the second digit of the second kind of group of the input sequence;

a second shared signal line is connected to the first terminal of the second transistor, wherein the first terminal of the second transistor is a same terminal shared with the second terminal of the preceding transistor of the second transistor; and the second terminal of the second transistor is connected to a signal line different from the second shared signal line.

* * * * *